United States Patent [19]

Meyer

[11] Patent Number: 4,971,564
[45] Date of Patent: Nov. 20, 1990

[54] METHOD AND ARTICLE USED FOR CONNECTING ELECTRONIC COMPONENTS

[76] Inventor: Ferdie Meyer, 5 Sidhof, 472 Walker Street,, Sunnyside, Pretoria, Transvaal Province, South Africa

[21] Appl. No.: 338,254

[22] Filed: Apr. 14, 1989

[30] Foreign Application Priority Data

Apr. 15, 1988 [ZA] South Africa .................... 88/2655

[51] Int. Cl.⁵ .................... H01R 9/09; H01R 43/00
[52] U.S. Cl. .................... 439/70; 29/854; 29/857; 174/261; 439/73; 439/400; 439/426; 439/427; 439/525; 439/750
[58] Field of Search .................... 29/854, 857; 174/68.5, 174/261; 361/410, 414, 413; 439/74, 68, 70, 73, 408, 426, 427, 525, 526, 400, 750, 751, 752; 434/224

[56] References Cited

U.S. PATENT DOCUMENTS

| | | | |
|---|---|---|---|
| 3,249,908 | 5/1966 | Fuller et al. | 174/68.5 X |
| 3,447,039 | 5/1969 | Branagan | 174/68.5 X |
| 3,496,419 | 2/1970 | Sakellakis | 174/68.5 X |
| 3,631,298 | 12/1971 | Davis | 174/261 X |
| 3,820,055 | 6/1974 | Huffnagle et al. | 439/400 |
| 4,129,349 | 12/1978 | Von Roesgen | 439/408 X |
| 4,697,858 | 10/1987 | Balakrishnan | 361/413 X |

Primary Examiner—Carl E. Hall
Assistant Examiner—Carl J. Arbes
Attorney, Agent, or Firm—Darby & Darby

[57] ABSTRACT

A method of and apparatus for connecting electronic components, uses the component pins for insertion in the end of insulated electrical wire. The pin and the electric conductor are held in galvanic contact by the insulation around the wire and a bracket is provided for holding wire ends in the correct configuration for receiving component leads.

10 Claims, 2 Drawing Sheets

METHOD AND ARTICLE USED FOR CONNECTING ELECTRONIC COMPONENTS

INTRODUCTION

This invention relates to a method and article used for constructing electronic circuits.

BACKGROUND TO THE INVENTION

Various methods of circuit constructions are available, both to hobbyists and professionals alike.

Solder methods usually require copper tracks laid down on some sort of substrate, to which components are soldered, either through holes in the substrate or on the same side as the copper track. Unfortunately printed circuit boards and copper stripped board are expensive and a certain amount of skill is required in setting out, and constructing the circuit. Invariably the circuit board layout does not resemble the circuit diagram.

Circuit prototypes can be constructed using the second method. A popular commercially available implementation is "proto-board". Components can be plugged into vacant sockets to implement a circuit. However, this method is only good for prototyping a circuit. A final circuit has to be transferred to a printed circuit board.

Particularly the connection of multi-pin components presents a problem. These components are either plugged into socket connectors or directly soldered, but in both cases solder is required.

OBJECT OF THE INVENTION

It is an object of this invention to provide a circuit construction method and apparatus that will be relatively cheap and simple, especially but not exclusively for the hobbyist and home constructor.

SUMMARY OF THE INVENTION

In accordance with this invention there is provided a method of making an electrical connection comprising inserting an electronic component lead into an end of an insulted electric wire to cause a galvanic connection between the lead and the wire while using the insulation to substantially hold the pin in the connected position.

Preferably the electric wire has a multistrand wire core, and a plurality of leads are inserted one each into a respective plurality of electric wires, the wires being held together in a formation shaped to receive the leads by a bracket device.

There is provided for the bracket to have a plurality of openings through which the wires are inserted, and in the case in which the component is a dual-in-line integrated circuit chip, for the bracket to be a rectangular plate having wire receiving openings matching the dual-in-line lead configuration.

Alternatively, a bracket in the form of a bar having a single line of openings may be used, with two brackets being used one for each side of the dual-in-line configuration.

A generally disc-shaped bracket having a triangular configuration of openings therethrough can be used for receiving transistors.

There is also provided apparatus for making an electrical connection by inserting an electronic component lead into an end of an insulted electric wire to cause a galvanic connection between the lead and the wire while using the insulation to substantially hold the pin in the connected position, comprising a bracket arranged to hold a plurality of wire ends together in a formation configured to received the leads of a component.

The bracket preferably has a plurality of openings through which the wires are insertable, and can comprise a rectangular plate having wire receiving openings matching the dual-in-line lead configuration of a dual-in-line integrated circuit chip.

The bracket may also be in the form of a bar having a single line of openings, which are configured to hold wire ends for receiving pins of one side of a dual-in-line configuration component.

Alternatively the bracket can be generally disc-shaped having a triangular configuration of openings therethrough for receiving transistors.

The invention extends to a circuit connected according to the above method or having the above defined apparatus.

BRIEF DESCRIPTION OF THE DRAWINGS

Preferred embodiments of the invention are described below by way of example only, and with reference to the accompanying drawings, in which.

DETAILED DESCRIPTION OF THE DRAWINGS

Figure 1:
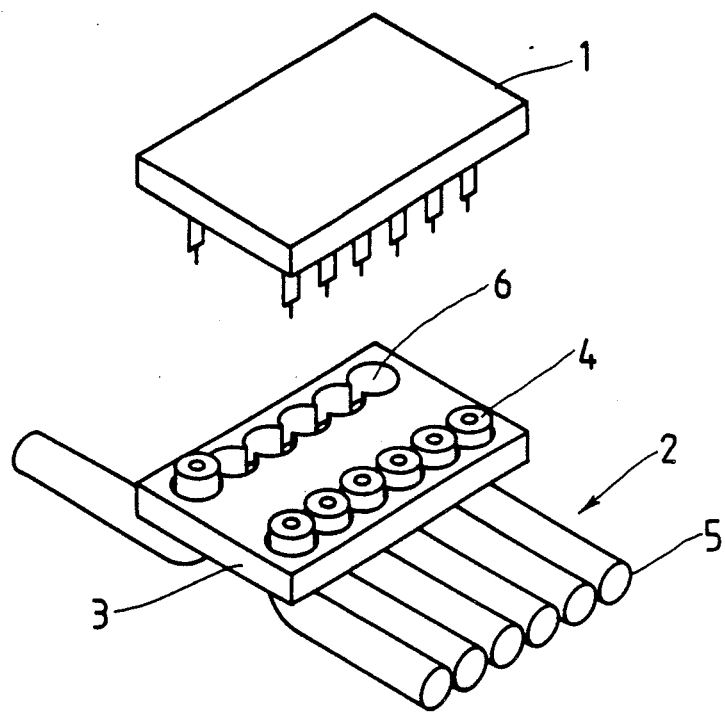
FIG. 1 is an isometric view of one application of the method of the invention in securing connections of a dual-in-line integrated chip.

Referring to FIG. 1, a conventional dual-in-line package integrated circuit (IC) chip (1) is shown which is to be connected to electrical wires (2) by the use of a bracket (3) of the invention.

The wires (2) are selected to have multistrand cores (4) of a relatively loose weave, and an insulation (5) which is of a generally soft and flexible, but firm, characteristic.

The bracket (5) is a rectangular plate, preferably of plastics material, with openings (6) therein in a dual-in-line configuration, with one opening being axially alignable with one each of the pins of the integrated circuit chip (1). The adjoining sides of the openings in the line are not partitioned from each other, but are open over short common distance. The openings are arranged to receive the diameter of the wire when inserted, in a suitably easy friction fit.

In use, the wires are inserted through the bracket openings and held in position, with the wire ends in a substantially co-linear configuration. The leads can be bent away from the bracket as illustrated, or otherwise conventiently positioned. The integrated circuit is then inserted with the leads pressing into the stranded core of each of the ends of the wires (4). The IC chip is pressed firmly in position and the wires can be adjusted individually to achieve the required contact position if necessary. A suitable glue may be used to fix the lead in position at the end of the wire.

Figure 2:
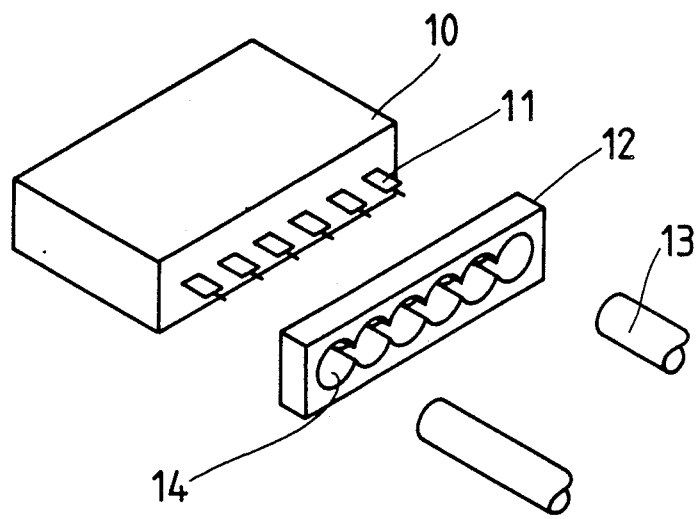
FIG. 2 is an alternative application of the method of the invention in securing the lead connections to a dual-in-line integrated circuit chip.

Referring to FIG. 2, an integrated circuit chip (10) is shown with its leads (11) bent to extend outwardly from the sides of the body, and a bracket (12) is used to locate wires (13) in a configuration in which they can receive the dual-in-line configuration of one side of the leads (11). The bracket (12) comprises an elongate rectangular section of plate, having openings (14) spaced along the long axis thereof, and extending through the major sides. The openings have their adjoining side walls cut away, and are dimensioned to receive electric wires (13) with the same kind of fit as described above with reference to FIG. 1.

In use, the wire leads (13) are pushed through the bracket openings (14) to project from the other side, where they are used to receive the pins or leads (11) of the integrated circuit chip (10). Glue may be used to secure the final connection if desired.

Figure 3:
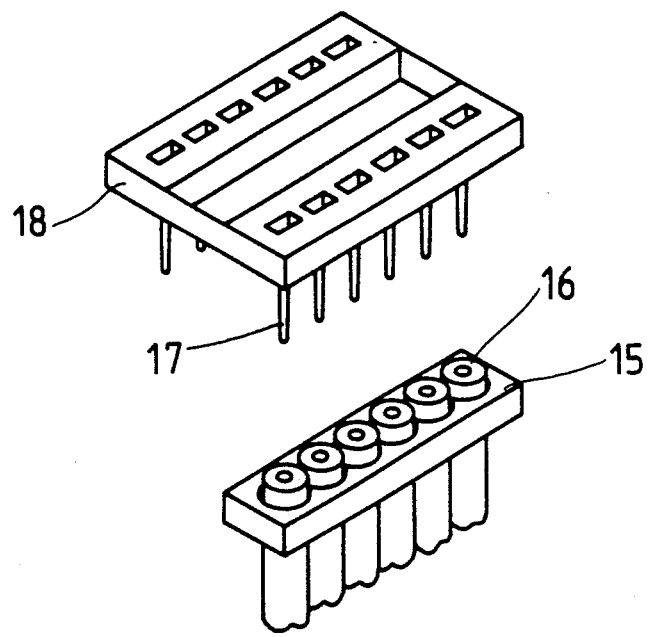
FIG. 3 is an isometric view of the use of the invention in connecting the leads of a component socket connector; and, FIG. 4 is an isometric view of the application of the method and suitable apparatus of the invention in securing electrical connections to the leads of a three pin transistor.

Referring to FIG. 3, a bracket (15) is shown with lead ends (16) projecting through openings in it, and the bracket is of the same design as that described with reference to FIG. 2. The bracket is shown located with the leads co-axial with dual-in-line pins (17) of an integrated circuit connector socket (18). Clearly the connector as an electronic component, may be connected to the wires by the method of the invention, and then a variety of integrated circuits may be plugged into or removed from the socket (18).

Figure 4:
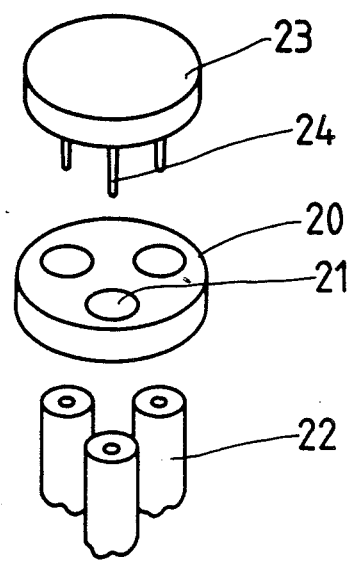

Referring to FIG. 4, a disc-shaped bracket according to the invention is shown, having three holes (21) passing through its major surfaces, and positioned therein approximately at the corners of an isosceles trangle. Wires (22) inserted through the openings in a suitably smooth but frictional fit, and any three legged device such as a transistor (23) can then have its leads (24) inserted into the wires (22) and thus electrically connected.

It has been found in practice that multistrand wire of a fairly loose weave with a reasonably elastic insulation therearound is suitable. It may be desirable to insert the sharpened end of a pencil or the like into the end of the lead to start an opening which the lead may be pushed into, and to provide a certain amount of lubrication for the lead. Although a lead end may be used more than once to make a connection, it is not the intention of the invention to provide a re-usable joint. The lead end can, if the wires become too frayed for further use, simply be cut off slightly shorter to present a new wire core for use. Circuits built according to the invention may be left on the circuit board and held in position with glue, for permanent use if required. Other connections may be made between the wires by passing metal pins through both wire cores, so to create a connection between the wires. Particularly for young children learning electronics, the wires may be laid out on a pictorial circuit diagram, to follow it closely.

What I claim as new and desired to secure by Letters Patent is:

1. Article for making an electrical connection between an electrical component lead and an insulated electric wire to cause an electrical connection between the lead and the wire , comprising a bracket arranged to hold a plurality of insulated wire ends together in a formation configured such that each insulated wire receives a component lead, the wire insulation holding the component lead and the electric wire in the connected position.

2. Article as claimed in claim 1 in which the bracket has a plurality of openings through which the wires are insertable.

3. Article as claimed in claim 2 in which the bracket is a rectangular plate having wire receiving openings matching the dual-in-line lead configuration of a dual-in-line integrated circuit chip.

4. Article as claimed in claim 2 in which the bracket is in the form of a bar having a single line of openings, configured to hold wire ends for receiving pins of one side of a dual-in-line configuration component.

5. Article as claimed in claim 2 in which the bracket is generally disc-shaped having a triangular configuration of openings therethrough for receiving transistors.

6. A method of making an electrical connection comprising inserting an electrical component lead into an end of an insulated electric wire having a multistrand wire core to cause an electrical connection between the lead and the wire, using the insulation to substantially hold the lead in the connection position, a plurality of leads inserted one each into a respective plurality of electric wires, using a bracket for holding the wirews together in a formation shaped to receive the leads.

7. A method as claimed in claim 6 in which the bracket has a plurality of opening through which the wires are inserted.

8. A method as claimed in claim 7 in which the component is a dual-in-line integrated circuit chip and the bracket is a rectangular plate having wire receiving openings matching the dual-in-line lead configuration.

9. A method as claimed in claim 8 in which the bracket is in the form of a bar having a single line of openings, and two brackets are used one for each side of the dual-in-line configuration.

10. A method as claimed in claim 8 in which the bracket is generally disc-shaped having a triangular configuration of openings therethrough for receiving transistors.

* * * * *